(12) United States Patent
Moonen

(10) Patent No.: US 7,091,492 B2
(45) Date of Patent: Aug. 15, 2006

(54) IMAGING DEVICE COMPRISING OPTICALLY COUPLED FIBER OPTIC PLATE ASSEMBLY

(75) Inventor: Daniel Moonen, Haarlem (NL)

(73) Assignee: Ropintassco Holdings, L.P., Deluth, GA (US)

(*) Notice: Subject to any disclaimer, the term of this patent is extended or adjusted under 35 U.S.C. 154(b) by 32 days.

(21) Appl. No.: 11/010,639

(22) Filed: Dec. 13, 2004

(65) Prior Publication Data

US 2006/0124858 A1   Jun. 15, 2006

(51) Int. Cl.
*H01J 37/244* (2006.01)
*H01J 37/18* (2006.01)

(52) U.S. Cl. .......... 250/397; 250/311; 250/227.11; 250/227.28; 250/227.24; 250/227.2; 385/31; 385/39; 385/50; 385/53; 385/80; 385/81; 385/89; 385/120

(58) Field of Classification Search ........ 250/397, 250/311.2, 27.11, 227.28, 227.24, 2; 385/31, 385/39, 50, 53, 80, 81, 89, 120

See application file for complete search history.

(56) References Cited

U.S. PATENT DOCUMENTS

| | | | | |
|---|---|---|---|---|
| 3,560,792 A | * | 2/1971 | Goetze et al. ........... 315/11 |
| 3,890,506 A | * | 6/1975 | Berninger ........... 250/370.09 |
| 3,967,123 A | * | 6/1976 | Deylius et al. ........... 250/368 |
| 4,783,137 A | | 11/1988 | Kosman et al. |
| 4,932,752 A | * | 6/1990 | Krashkevich et al. ....... 385/142 |
| 5,065,029 A | * | 11/1991 | Krivanek ........... 250/441.11 |
| 5,074,683 A | | 12/1991 | Tam et al. |
| 5,334,832 A | | 8/1994 | Levinson et al. |
| 5,394,254 A | * | 2/1995 | Cheng ........... 349/159 |
| 5,881,195 A | * | 3/1999 | Walker ........... 385/116 |
| 6,236,634 B1 | | 5/2001 | Lee et al. |
| 6,271,510 B1 | | 8/2001 | Boxen |
| 6,455,860 B1 | | 9/2002 | Mooney |
| 6,570,164 B1 | * | 5/2003 | Mooney ........... 250/397 |
| 6,655,849 B1 | | 12/2003 | Malavieille et al. |
| 6,665,469 B1 | | 12/2003 | Schroll et al. |
| 6,895,077 B1 | * | 5/2005 | Karellas et al. ........... 378/98.3 |
| 2003/0201462 A1 | | 10/2003 | Pommer et al. |
| 2003/0219207 A1 | | 11/2003 | Guy |

* cited by examiner

*Primary Examiner*—John R. Lee
*Assistant Examiner*—Bernard E. Souw
(74) *Attorney, Agent, or Firm*—Dinsmore & Shohl LLP

(57) ABSTRACT

A fiber optic plate assembly is provided for transferring optical signals to a detector or other optical element within an imaging device or imaging system. The fiber optic plate assembly comprises first and second fiber optic plates coupled via an optical coupling gel configured to permit separation of the two plates from each other to permit repair or replacement of one of the plates. Alternatively, the imaging device may comprise a single fiber optic plate coupled directly to an optical detector.

31 Claims, 4 Drawing Sheets

US 7,091,492 B2

IMAGING DEVICE COMPRISING OPTICALLY COUPLED FIBER OPTIC PLATE ASSEMBLY

BACKGROUND OF THE INVENTION

The present invention relates to imaging devices and, more particularly, to imaging devices and systems that employ one or more fiber-optic plates to transfer optical signals to a detector or other optical element within the imaging device or system.

BRIEF SUMMARY OF THE INVENTION

According to the present invention, a fiber optic plate assembly is provided for transferring optical signals to a detector or other optical element within an imaging device or imaging system. The fiber optic plate assembly comprises first and second fiber optic plates coupled via an optical coupling gel configured to permit separation of the two plates from each other to permit repair or replacement of one of the plates. The fiber optic plate assembly may alternatively comprise a fiber optic plate coupled directly to an optical detector via an optical coupling gel.

In accordance with one embodiment of the present invention, an electron beam imaging system is provided. The system comprises an electron beam source configured to direct a specimen analysis beam of electrons in the direction of a specimen under examination and an imaging device configured to generate an image representing the specimen. The imaging device comprises first and second fiber optic plates and an optical detector. The electron beam imaging system comprises an evacuation chamber accommodating the specimen, the beam of electrons, and the imaging device. The output face of the first fiber optic plate is optically coupled and bonded to the input face of the optical detector. The input face of the second fiber optic plate is coated with an optical scintillator while the output face of the second fiber optic plate is optically coupled to the input face of the first fiber optic plate via an optical coupling gel. The optical coupling gel is configured to flow under a given shear rate and the bond between the first fiber optic plate and the detector is configured to withstand a shear rate greater than the given shear rate at which the gel is configured to flow. In this manner, the second fiber optic plate may be disengaged from the first fiber optic plate without substantial disturbance to the integrity of the bond between the first fiber optic plate and the detector.

In accordance with another embodiment of the present invention, an imaging device is provided comprising first and second fiber optic plates and an optical detector. The output face of the first fiber optic plate is optically coupled to the input face of the optical detector. The output face of the second fiber optic plate is optically coupled to the input face of the first fiber optic plate via a thixotropic optical coupling gel.

In accordance with yet another embodiment of the present invention, the output face of the second fiber optic plate is optically coupled to the input face of the first fiber optic plate via an optical coupling gel configured to flow under a given shear rate. The bond between the first fiber optic plate and the detector is configured to withstand a shear rate greater than the given shear rate at which the gel is configured to flow, enabling disengagement of the second fiber optic plate from the first fiber optic plate without substantial disturbance to the integrity of the bond between the first fiber optic plate and the detector.

In accordance with yet another embodiment of the present invention, an imaging device is provided comprising a single fiber optic plate coupled directly to an optical detector.

In accordance with yet another embodiment of the present invention, a directed beam imaging system is provided comprising a beam source configured to direct a specimen analysis beam in the direction of a specimen under examination, and an imaging device according to the present invention.

Accordingly, it is an object of the present invention to provide improved imaging device and imaging systems. Other objects of the present invention will be apparent in light of the description of the invention embodied herein.

BRIEF DESCRIPTION OF THE SEVERAL VIEWS OF THE DRAWINGS

The following detailed description of specific embodiments of the present invention can be best understood when read in conjunction with the following drawings, where like structure is indicated with like reference numerals and in which.

DETAILED DESCRIPTION

Figure 1:
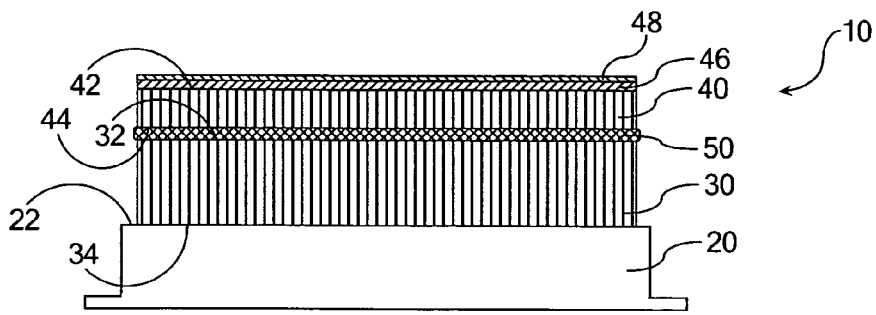
FIG. 1 is an illustration of an imaging device according to one embodiment of the present invention.

Referring initially to FIG. 1, an imaging device 10 according to one embodiment of the present invention is illustrated. Generally, the imaging device 10 comprises an optical detector 20, a first fiber optic plate 30 and a second fiber optic plate 40. The specific structure of these general components is beyond the scope of the present invention and may be gleaned from any of a variety of teachings in the art of optical imaging. For example, U.S. Pat. Nos. 6,570,164 and 5,065,029, the disclosures of which are incorporated herein by reference, present a more detailed discussion of fiber optic plates and optical detectors.

As is illustrated in FIG. 1, the output face 34 of the first fiber optic plate 30 is optically coupled and bonded to the input face 22 of the optical detector 20. The output face 44 of the second fiber optic plate 40 is optically coupled to the input face 32 of the first fiber optic plate 30 via an optical coupling gel 50.

The bond between the first fiber optic plate 30 and the detector 20 is configured to withstand a shear rate greater than the shear rate at which the gel 50 is configured to flow. Stated differently, the degree of securement between the first fiber optic plate 30 and the detector 20 exceeds the degree of securement between the first fiber optic plate 30 and the second fiber optic plate 40. In this manner, the second fiber optic plate 40 may be disengaged from the first fiber optic plate 30 without substantial disturbance to the integrity of the bond between the first fiber optic plate 30 and the detector 20. The second fiber optic plate 40 may then be repaired or replaced and re-engaged with the first fiber optic plate 30. It is contemplated that, upon disengagement, some of the gel may remain affixed to the second fiber optic plate 40 and that subsequent re-engagement with a new fiber optic plate may require replacement of some of the optical coupling gel 50.

Although it is contemplated that the optical medium 46 may comprise any medium configured to enhance optical imaging, typically, the optical medium 46 comprises a scintillator configured to emit optical photons. It is noted that replacement or repair of the second fiber optic plate 40 is often necessary because the optical medium 46 coated on the input face 42 of the second fiber optic plate 40 is often prone to environmental damage from, for example, scratching or other contact damage, excessive radiation exposure, contamination, etc. The optical medium 46 may be coated with a protective layer 48 to help protect against such damage. As will be appreciated by those practicing the present invention, the effect of the protective layer 48 on the optical imaging process should be minimized by, for example, ensuring that the protective layer 48 is transparent to the charged particles or radiation incident upon the detector 10.

It is contemplated that the optical coupling gel 50 can be any of a variety of suitable optical coupling gels. Thixotropic optical coupling gels available from Nye Lubricants, Inc., of Fairhaven, Mass., and other thixotropic optical coupling gels available from similar manufacturers are examples of suitable optical coupling gels. The thixotropic gel, which defines an apparent viscosity that is inversely related to shear rate, is typically selected such that, at room temperature and under static conditions, it is capable of supporting its own weight and the weight of the second fiber optic plate 40 without substantial flow. Under substantial shear, the thixotropic optical coupling gel flows readily, permitting convenient removal of the second fiber optic plate 40 for replacement or repair. Stated differently, the thixotropic gel tends to liquefy when subject to relatively high shear rates and then solidify again when left standing.

Suitable thixotropic optical coupling gels will be characterized by an apparent viscosity that varies depending upon the particular design constraints of the application at issue. For example, it is contemplated that apparent viscosities as low as about 5,000 poise may be suitable in many contexts but that other applications will require apparent viscosities of at least about 7,000 poise. Further, it is noted that particular advantages reside in the use of thixotropic optical coupling gels defining an apparent viscosity of at least about 10,000 poise.

The detector 20 may comprise any suitable optical detector and will typically define an array of detection pixels. For example and by way of illustration, not limitation, the detector 20 may comprise a CCD array, a photodiode array, or a CMOS detector. In addition, it is contemplated that imaging devices according to the present invention may comprise the optical detector 20 and one or more of a variety of additional components selected from, for example, an energy selecting slit, a charged particle dispersing device, a charged particle lens, a charged particle deflector, a charged particle energy filter, a charged particle scintillator, a fiber optic coupler, etc.

Figure 2:
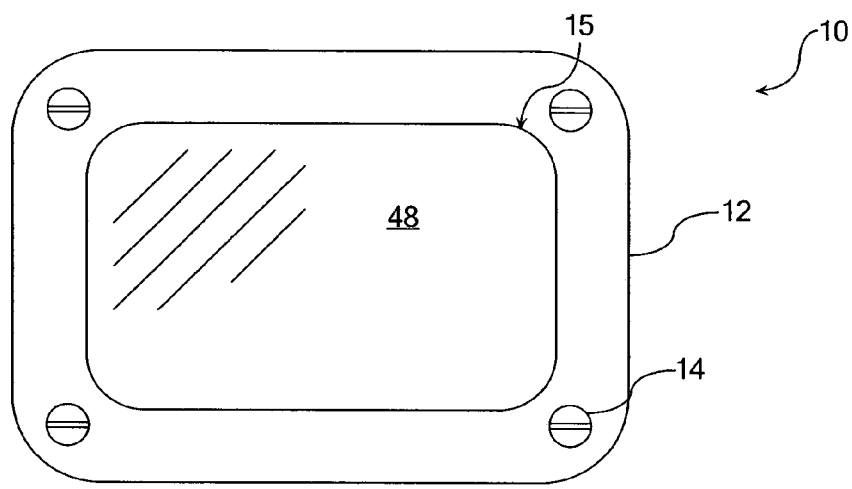
FIGS. 2 and 3 are top and front views of an enclosed imaging device according to one embodiment of the present invention.
Figure 3:
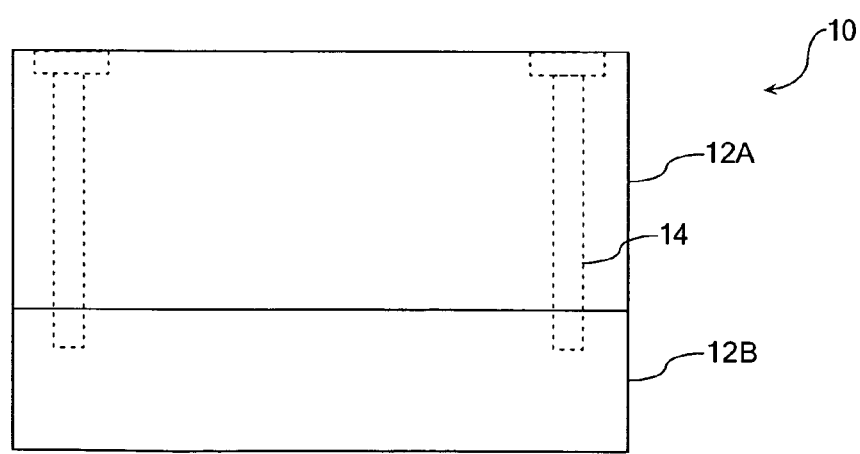

As is illustrated in FIGS. 2 and 3, the imaging device may further comprise a compression frame 12 configured to maintain a given degree of compression on the thixotropic optical coupling gel 50 between the first and second fiber optic plates 30, 40. In the illustrated embodiment, the compression frame comprises a plurality of compression bolts 14 configured to fixedly engage upper and lower portions 12A, 12B of the frame 12. The compression frame 12 is configured to enclose substantially the entire imaging device 10 and define a transmission window 15 over the input face 42 of the second fiber optic plate 40. It is contemplated that the compression frame illustrated in FIGS. 2 and 3 is presented for illustrative purposes and that a variety of design variations will be suitable for the frame itself and the hardware used to impart compression on the gel 50.

Figure 4:
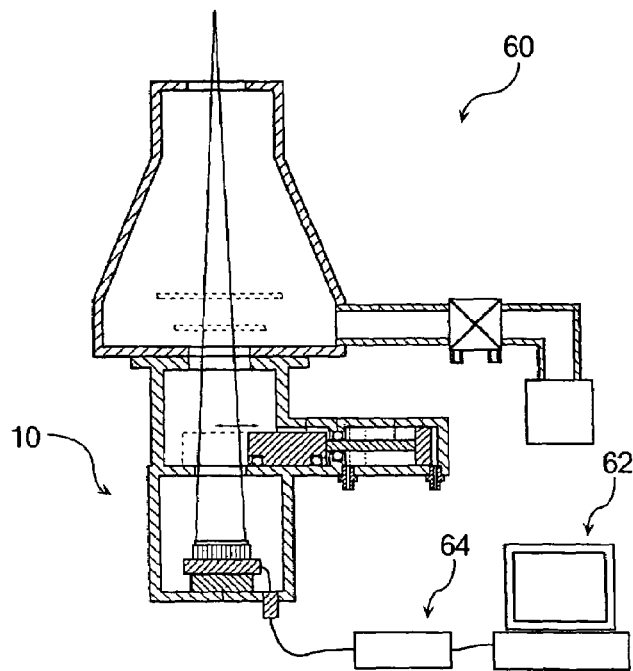
FIG. 4 is a schematic illustration of an imaging device according to the present invention mounted at the bottom of a TEM column.
Figure 5:
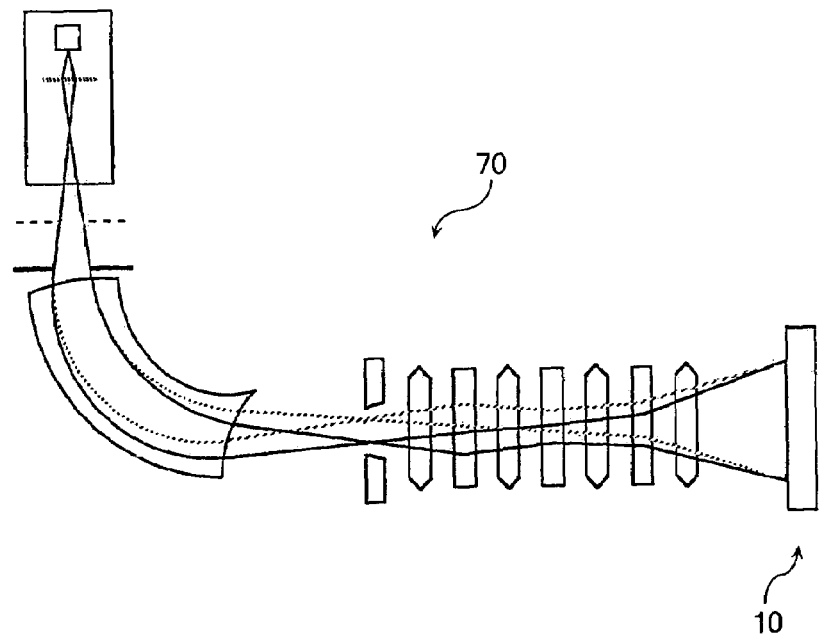
FIG. 5 is a schematic illustration of an imaging device according to the present invention mounted at the end of an imaging filter.
Figure 6:
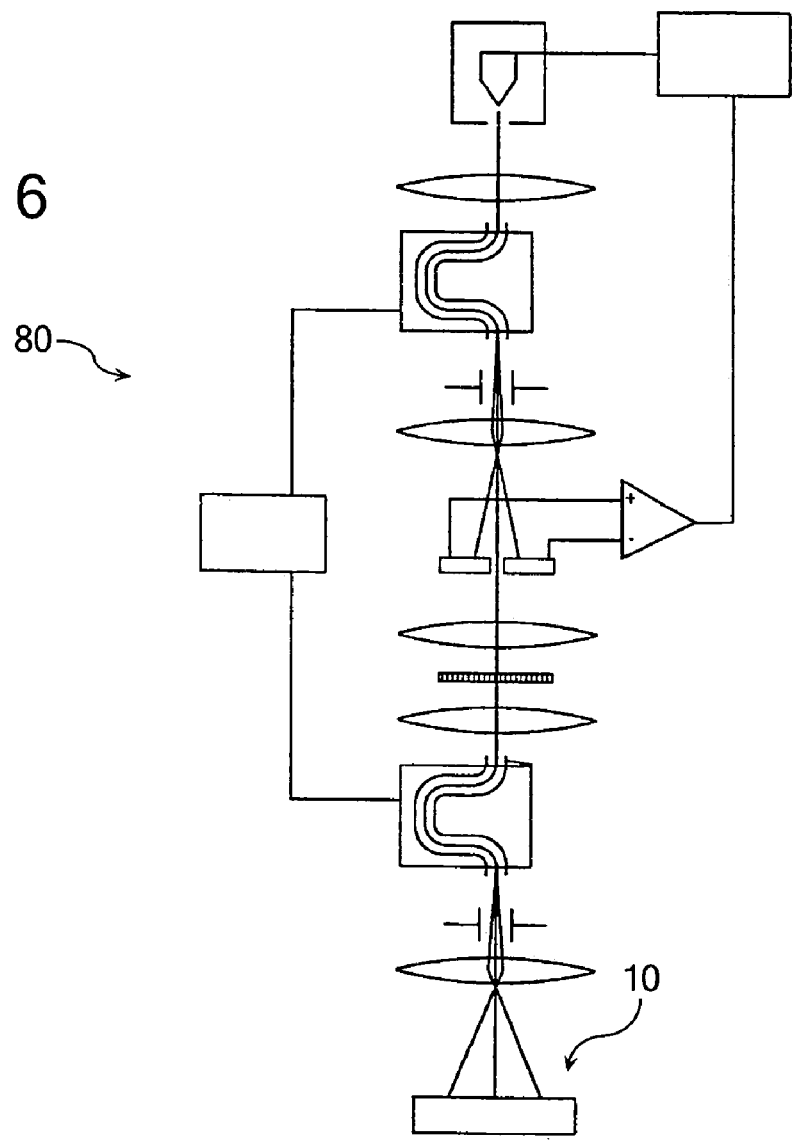
FIG. 6 is a schematic illustration of an imaging device according to the present invention mounted at the end of an electron energy loss spectrometer.

Imaging devices according to the present invention may be used in conjunction with a variety of directed beam imaging systems. For the purposes of defining and describing the present invention, it is noted that a directed beam imaging system comprises any system where a beam of electromagnetic radiation or charged particles is directed at a specimen under examination to generate an image representing the specimen. The image may be a single or multi-dimensional image, a diffraction pattern, or any other suitable representation of the specimen. By way of illustration and not limitation, as is illustrated in FIGS. 4–6, discussed below, electron beam imaging systems according to the present invention may comprise an evacuation chamber accommodating the specimen under examination, the beam of electrons, and the imaging device. It is contemplated that the evacuation chamber may include a set of separate sub-chambers in communication with each other, as is illustrated in FIG. 4.

By way of illustration, not limitation, as shown schematically in FIG. 4, an imaging device 10 according to the present invention may be mounted in the bottom of a TEM column 60, such as, for example, the TEM described in Krivanek, U.S. Pat. No. 5,065,029, the entire disclosure of which is hereby incorporated by reference. FIG. 4 also illustrates the use of a user interface 62 and a controller 64 programmed to enable a user to coordinate operation of the device. It is noted that the user interface 62 and the controller 64 may take a variety of suitable forms and may be utilized in a variety of embodiments of the present invention.

As a further example, referring to the schematic illustration of FIG. 5, an imaging device 10 according to the present invention may be mounted to the end of an imaging filter 70, such as, for example, the energy-selected electron imaging filter described in Krivanek, U.S. Pat. No. 4,851,670, the entire disclosure of which is hereby incorporated by reference.

In yet another embodiment of the invention schematically illustrated in FIG. 6, an imaging device 10 of the present invention may be mounted on the end of an electron energy loss spectrometer (EELS) 80, such as, for example, the EELS device described in Krivanek, U.S. Pat. No. 5,097,126, the entire disclosure of which is hereby incorporated by reference.

Figure 7:
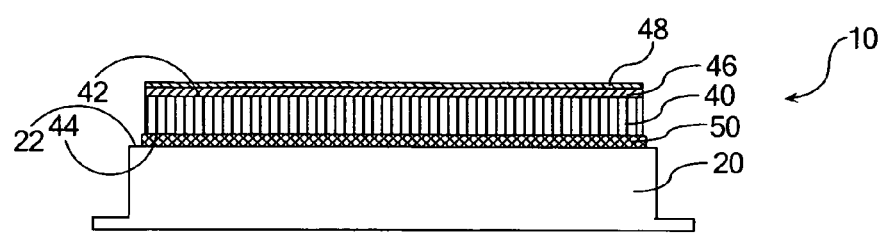
FIG. 7 is an illustration of an imaging device according to an alternative embodiment of the present invention.

Referring finally to FIG. 7, it is noted that an imaging device according to the present invention need not include the first fiber optic plate 30. Rather, the second fiber optic plate 30 may be bonded directly to the detector 20 via a thixotropic optical coupling gel 50, preferably held in compression by a suitable compressive framework. The gel 50 is preferably held in compression without the interference of any intervening spacer elements or other structure present between the fiber optic plate 40 and the input face of the detector 20 that would otherwise interfere with compression of the gel 50.

It is noted that terms like "preferably," "commonly," and "typically" are not utilized herein to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention.

For the purposes of describing and defining the present invention it is noted that the term "device" is utilized herein to represent a combination of components and individual components, regardless of whether the components are combined with other components. Further, it is noted that the term "substantially" is utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

Having described the invention in detail and by reference to specific embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention.

What is claimed is:

1. An electron beam imaging system comprising an electron beam source configured to direct a specimen analysis beam of electrons in the direction of a specimen under examination, and an imaging device configured to generate an image representing said specimen, wherein:
    said imaging device comprises first and second fiber optic plates and an optical detector;
    said electron beam imaging system comprises an evacuation chamber accommodating said specimen, said beam of electrons, and said imaging device;
    said optical detector defines an input face;
    said first fiber optic plate defines an input face and an output face;
    said output face of said first fiber optic plate is optically coupled and bonded to said input face of said optical detector;
    said second fiber optic plate defines an input face and an output face;
    said input face of said second fiber optic plate is coated with an optical scintillator configured to emit optical photons in response to incident electrons;
    said output face of said second fiber optic plate is optically coupled to said input face of said first fiber optic plate via an optical coupling gel;
    said optical coupling gel is configured to flow under a given shear rate; and
    said bond between said first fiber optic plate and said detector is configured to withstand a shear rate greater than said given shear rate at which said gel is configured to flow, enabling disengagement of said second fiber optic plate from said first fiber optic plate without substantial disturbance to the integrity of the bond between said first fiber optic plate and said detector.

2. A directed beam imaging system comprising a beam source configured to direct a specimen analysis beam in the direction of a specimen under examination, and an imaging device configured to generate an image representing said specimen, wherein:
    said imaging device comprises first and second fiber optic plates and an optical detector;
    said optical detector defines an input face;
    said first fiber optic plate defines an input face and an output face;
    said output face of said first fiber optic plate is optically coupled and bonded to said input face of said optical detector;
    said second fiber optic plate defines an input face and an output face;
    said input face of said second fiber optic plate is coated with an optical medium;
    said output face of said second fiber optic plate is optically coupled to said input face of said first fiber optic plate via an optical coupling gel;
    said optical coupling gel is configured to flow under a given shear rate; and
    said bond between said first fiber optic plate and said detector is configured to withstand a shear rate greater than said given shear rate at which said gel is configured to flow, enabling disengagement of said second fiber optic plate from said first fiber optic plate without substantial disturbance to the integrity of the bond between said first fiber optic plate and said detector.

3. A directed beam imaging system as claimed in claim 2 wherein said beam source comprises a charged particle source.

4. A directed beam imaging system as claimed in claim 3 wherein said charged particles comprise electrons, protons, ions, or combinations thereof.

5. A directed beam imaging system as claimed in claim 3 wherein said charged particles comprise electrons characterized by a kinetic energy of at least about 1 keV.

6. A directed beam imaging system as claimed in claim 2 wherein said beam source comprises an x-ray source.

7. A directed beam imaging system as claimed in claim 2 wherein said directed beam imaging system comprises an electron microscope.

8. A directed beam imaging system as claimed in claim 7 wherein said electron microscope further comprises an electron energy loss spectrometer.

9. An imaging device comprising first and second fiber optic plates and an optical detector, wherein:
    said optical detector defines an input face;
    said first fiber optic plate defines an input face and an output face;
    said output face of said first fiber optic plate is optically coupled to said input face of said optical detector;
    said second fiber optic plate defines an input face and an output face;
    said output face of said second fiber optic plate is optically coupled to said input face of said first fiber optic plate via a thixotropic optical coupling gel; and
    said input face of said second fiber optic plate is coated with an optical medium.

10. An imaging device as claimed in claim 9 wherein:
    said thixotropic optical coupling gel is configured to flow under a given shear rate;
    said first fiber optic plate is bonded to said input face of said detector; and
    said bond between said first fiber optic plate and said detector is configured to withstand a shear rate greater than said given shear rate at which said gel is configured to flow, enabling disengagement of said second fiber optic plate from said first fiber optic plate without substantial disturbance to the integrity of the bond between said first fiber optic plate and said detector.

11. An imaging device as claimed in claim 9 wherein, at room temperature and under static conditions, said thixotropic optical coupling gel is configured to support its own weight without substantial flow.

12. An imaging device as claimed in claim 11 wherein, at room temperature and under substantial shear, said thixotropic optical coupling gel is configured to flow under its own weight.

13. An imaging device as claimed in claim 9 wherein, at room temperature and under static conditions, said thixotropic optical coupling gel is configured to support the weight of said second fiber optic plate without substantial flow.

14. An imaging device as claimed in claim 13 wherein, at room temperature and under substantial shear, said thixotropic optical coupling gel is configured to flow under the weight of said second fiber optic plate.

15. An imaging device as claimed in claim 9 wherein said thixotropic optical coupling gel defines an apparent viscosity that is inversely related to shear rate.

16. An imaging device as claimed in claim 9 wherein, at room temperature, said thixotropic optical coupling gel defines an apparent viscosity of at least about 5,000 poise.

17. An imaging device as claimed in claim 9 wherein, at room temperature, said thixotropic optical coupling gel defines an apparent viscosity of at least about 7,000 poise.

18. An imaging device as claimed in claim 9 wherein, at room temperature, said thixotropic optical coupling gel defines an apparent viscosity of at least about 10,000 poise.

19. An imaging device as claimed in claim 9 wherein said detector defines an array of detection pixels.

20. An imaging device as claimed in claim 9 wherein said detector comprises a CCD array, a photodiode array, or a CMOS detector.

21. An imaging device as claimed in claim 9 wherein said imaging device comprises said optical detector and one or more components selected from an energy selecting slit, a charged particle dispersing device, a charged particle lens, a charged particle deflector, a charged particle energy filter, a charged particle scintillator, and a fiber optic coupler.

22. An imaging device as claimed in claim 9 wherein said first fiber optic plate is bonded to said input face of said detector.

23. An imaging device as claimed in claim 22 wherein said first fiber optic plate is bonded to said input face of said detector via an adhesive.

24. An imaging device as claimed in claim 9 wherein a degree of securement between said first fiber optic plate and said detector exceeds a degree of securement between said first fiber optic plate and said second fiber optic plate.

25. An imaging device as claimed in claim 9 wherein said optical medium coated on said input face of said second fiber optic plate is more prone to environmental damage than said first and second fiber optic plates.

26. An imaging device as claimed in claim 25 wherein said environmental damage comprises contact damage, excessive radiation exposure, contamination, and combinations thereof.

27. An imaging device as claimed in claim 9 wherein said optical medium comprises a scintillator configured to emit optical photons.

28. An imaging device as claimed in claim 9 wherein said imaging device further comprises a compression frame configured to maintain a given degree of compression on said thixotropic optical coupling gel between said first and second fiber optic plates.

29. An imaging device as claimed in claim 9 wherein said compression frame is further configured to enclose substantially all of said imaging device and define a transmission window over said input face of said second fiber optic plate.

30. An imaging device comprising first and second fiber optic plates and an optical detector, wherein:
said optical detector defines an input face;
said first fiber optic plate defines an input face and an output face;
said output face of said first fiber optic plate is optically coupled and bonded to said input face of said optical detector;
said second fiber optic plate defines an input face and an output face;
said input face of said second fiber optic plate is coated with an optical medium;
said output face of said second fiber optic plate is optically coupled to said input face of said first fiber optic plate via an optical coupling gel;
said optical coupling gel is configured to flow under a given shear rate; and
said bond between said first fiber optic plate and said detector is configured to withstand a shear rate greater than said given shear rate at which said gel is configured to flow, enabling disengagement of said second fiber optic plate from said first fiber optic plate without substantial disturbance to the integrity of the bond between said first fiber optic plate and said detector.

31. An imaging device comprising a fiber optic plate and an optical detector, wherein:
said optical detector defines an input face;
said fiber optic plate defines an input face and an output face;
said output face of said first fiber optic plate is optically coupled to said input face of said optical detector via an optical coupling gel;
said device further comprises a compression frame configured to maintain a given degree of compression on said thixotropic optical coupling gel between said first and second fiber optic plates;
said optical coupling gel is configured to maintain a solid state when held under compression by said frame and liquefy when subject to increasing shear rates; and
said device is configured such that said gel is held in compression without interference by any intervening structure present between said fiber optic plate and said input face of said detector.

* * * * *